(12) United States Patent
Corisis

(10) Patent No.: US 6,903,464 B2
(45) Date of Patent: Jun. 7, 2005

(54) SEMICONDUCTOR DIE PACKAGE

(75) Inventor: David J. Corisis, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/354,531

(22) Filed: Jan. 30, 2003

(65) Prior Publication Data

US 2004/0150088 A1 Aug. 5, 2004

(51) Int. Cl.[7] .................. H01L 21/44; H01L 21/48; H01L 21/50
(52) U.S. Cl. .................. 257/784; 257/783; 438/118
(58) Field of Search .................. 257/784, 783, 257/778, 786, 777; 438/108, 125, 118; 174/52.4

(56) References Cited

U.S. PATENT DOCUMENTS

| | | | |
|---|---|---|---|
| 6,210,992 B1 | 4/2001 | Tandy et al. | 438/106 |
| 6,265,766 B1 | 7/2001 | Moden | 257/678 |
| 6,268,649 B1 | 7/2001 | Corisis et al. | 257/686 |
| 6,294,825 B1 | 9/2001 | Bolken et al. | 257/676 |
| 6,329,220 B1 | 12/2001 | Bolken et al. | 438/106 |
| 6,339,253 B1 | 1/2002 | Corisis | 257/676 |
| 6,372,552 B1 | 4/2002 | Kinsman et al. | 438/124 |
| 6,376,277 B2 | 4/2002 | Corisis | 438/106 |
| 6,414,391 B1 | 7/2002 | Corisis et al. | 257/738 |
| 6,461,897 B2 * | 10/2002 | Lin et al. | 438/109 |
| 6,462,274 B1 * | 10/2002 | Shim et al. | 174/52.4 |
| 6,518,654 B1 | 2/2003 | Bolken et al. | 257/678 |
| 6,563,205 B1 * | 5/2003 | Fogal et al. | 257/686 |
| 6,576,496 B1 * | 6/2003 | Bolken et al. | 438/110 |
| 6,683,374 B2 * | 1/2004 | Goller et al. | 257/686 |
| 6,707,143 B2 * | 3/2004 | Fujimoto et al. | 257/686 |
| 6,710,455 B2 * | 3/2004 | Goller et al. | 257/777 |
| 2001/0037892 A1 | 11/2001 | Corisis | 174/52.1 |
| 2002/0053736 A1 | 5/2002 | Corisis | 257/730 |
| 2002/0172024 A1 | 11/2002 | Hui et al. | 361/767 |

* cited by examiner

Primary Examiner—S. V. Clark
(74) Attorney, Agent, or Firm—Whyte Hirschboeck Dudek SC

(57) ABSTRACT

Semiconductor die assemblies, die packages, methods for fabricating the semiconductor die assemblies and packages, and systems incorporating the die packages are provided. The die assembly construction allows for a ball grid array to extend beyond the width of a semiconductor die and increase the capacity for external contacts while maintaining the size of the assembly and package to correspond to the lengthwise dimension of the die.

130 Claims, 8 Drawing Sheets

SEMICONDUCTOR DIE PACKAGE

FIELD OF THE INVENTION

This invention relates generally to construction and packaging of semiconductor dies, and more particularly to a die assembly and methods of fabricating the assembly and packages incorporating the assembly, using an interposer to increase capacity of external contacts such as solder balls.

BACKGROUND OF THE INVENTION

The packaging of electrical circuits is a key element in the technological development of any device containing electrical components. Integrated circuit (IC) chips are enclosed in plastic packages that enable electrical connection of the chip to other circuits. Packaging IC chips has involved the placement of a chip on a flexible board where following adhesion of the chip to the board and wire bonding to connect the leads from the chip to the terminals on the board, an encapsulant is flowed over the chip and board to form a sealed package.

Developments in semiconductor fabrication processes provides for integration of large numbers of transistors, diodes, and other circuit elements onto a single IC chip. Such IC chips generally require a large number of electrical connections to receive inputs and to supply outputs. Because these integrated circuits are generally very small, the required input/output electrical connections on the integrated circuit are both numerous and densely spaced.

Several technologies have been developed to provide a means of mounting these electrical connections on a surface of a substrate, such as a printed circuit board (PCB). One method of packaging integrated circuits for electrical connection to a PCB is the so-called ball grid array (BGA) package.

A BGA semiconductor package generally includes a semiconductor chip (an integrated circuit) mounted on the top surface of a substrate. Electrical connections are made from the die to the substrate with bond wires that are attached to bond pads provided on the die and the substrate. The bond pads on the substrate are electrically connected to an array of solder balls or bumps, and these solder balls are used to bond and as input/output terminals for electrically connecting the substrate to a PCB or other external device.

A drawback of conventional BGA packaging is the limited space available for attachment of solder balls for connection to an external device. Another drawback is that the package is longer than the chip in both the X and Y directions (i.e., width and length).

SUMMARY OF THE INVENTION

The present invention relates to a semiconductor die packaging construction, which allows for the ball grid array to be wider than the width of the semiconductor die, methods for fabricating the semiconductor die device, and systems incorporating the device.

In one aspect, the invention provides semiconductor die assembly. In one embodiment, the die assembly comprises a semiconductor die mounted on a support substrate having a slot such that the support substrate extends beyond the die in a widthwise but not in a lengthwise direction. An exemplary support substrate comprises a plastic laminate material. In one embodiment, the support substrate comprises a pair of interposer substrates mounted on the semiconductor die to provide the slot thereinbetween. In another embodiment, the support substrate comprises a unitary substrate with the slot disposed therein. Bonding elements such as wire bonds can electrically connect elements (e.g., bond pads) on the active surface of the die through the slot to contacts (e.g. terminal pads) on the second surface of the support substrate. A plurality of external contacts (e.g., solder balls) can be mounted on the second surface of the support substrate.

In another embodiment, the semiconductor die assembly comprises a semiconductor die or integrated circuit chip having bond pads disposed on the active surface, mounted on a pair of interposers having terminal pads disposed on a first surface, the length of each of the interposers being about equal to or less than the length of the semiconductor die. The active surface of the semiconductor die is mounted onto the second surface of each of the pair of interposers such that a gap having a width is defined between the interposers, and the bond pads of the semiconductor die are disposed within the gap. The combined widths of the interposers and the width of the gap is greater than the width of the semiconductor die such that each interposer extends beyond the sides of the die in a widthwise orientation. The interposers are also mounted so as not to extend beyond the sides of the die in a lengthwise orientation.

In another embodiment, the semiconductor assembly comprises a semiconductor die having an active surface, a length and a width, and bond pads disposed on the active surface; and means for supporting the semiconductor die, the supporting means having a slot with a width disposed therein, and terminal pads disposed on a first surface; means for mounting the semiconductor die on the supporting means; and means for electrically connecting the bond pads to the terminal pads on the supporting means. The semiconductor die is mounted on the supporting means with the mounting means disposed therebetween, the bond pads of the semiconductor die disposed within the slot of the supporting means, and the supporting means disposed within the length of the semiconductor die and the extending beyond the width of the semiconductor die.

In another aspect, the invention provides a semiconductor die package. In various embodiments, the package comprises a die assembly according to the invention, at least partially encapsulated. The package can further include external contacts disposed on the second surface of the substrate for attaching the package as a component to an external electrical apparatus or device.

In another aspect, the invention provides methods of fabricating the foregoing die assemblies and semiconductor die packages. In one embodiment, the method comprises the steps of providing a semiconductor die that has an active surface (circuit side) with bond pads disposed thereon; providing a support substrate having a slot therethrough and terminal pads disposed on a first surface; and mounting the second surface of the support substrate onto the active surface of the semiconductor die such that the bond pads are disposed through the slot and the die extends beyond the support substrate lengthwise and the substrate extends beyond the die widthwise.

In one embodiment of the method, a support comprising a pair of interposers is mounted on the active surface of the semiconductor die to provide a gap (slot) thereinbetween with the bond pads disposed therethrough. The interposers are mounted on the die such that a) the combined widths of the interposers with the width of the slot is greater that the width of the semiconductor die, and the interposers extend outward from the die in a widthwise direction, and b) the interposers do not extend beyond the die in a lengthwise direction. In another embodiment of the method, a support comprising a unitary substrate with a slot therethrough is mounted onto the active surface of the die such that the bond pads are disposed through the slot, and the support substrate extends beyond the sides of the die in a widthwise direction but not in a lengthwise direction.

The method can further comprise electrically connecting the bond pads to the terminal pads, and mounting electrical contacts (e.g., solder balls) onto the first surface of the support substrate. In forming the assembly as a die package, at least a portion of the die can be encapsulated.

In still further aspect, the invention provides a system comprising a microprocessor in communication with a memory device that comprises a semiconductor die package according to the invention.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE INVENTION

Figure 1:
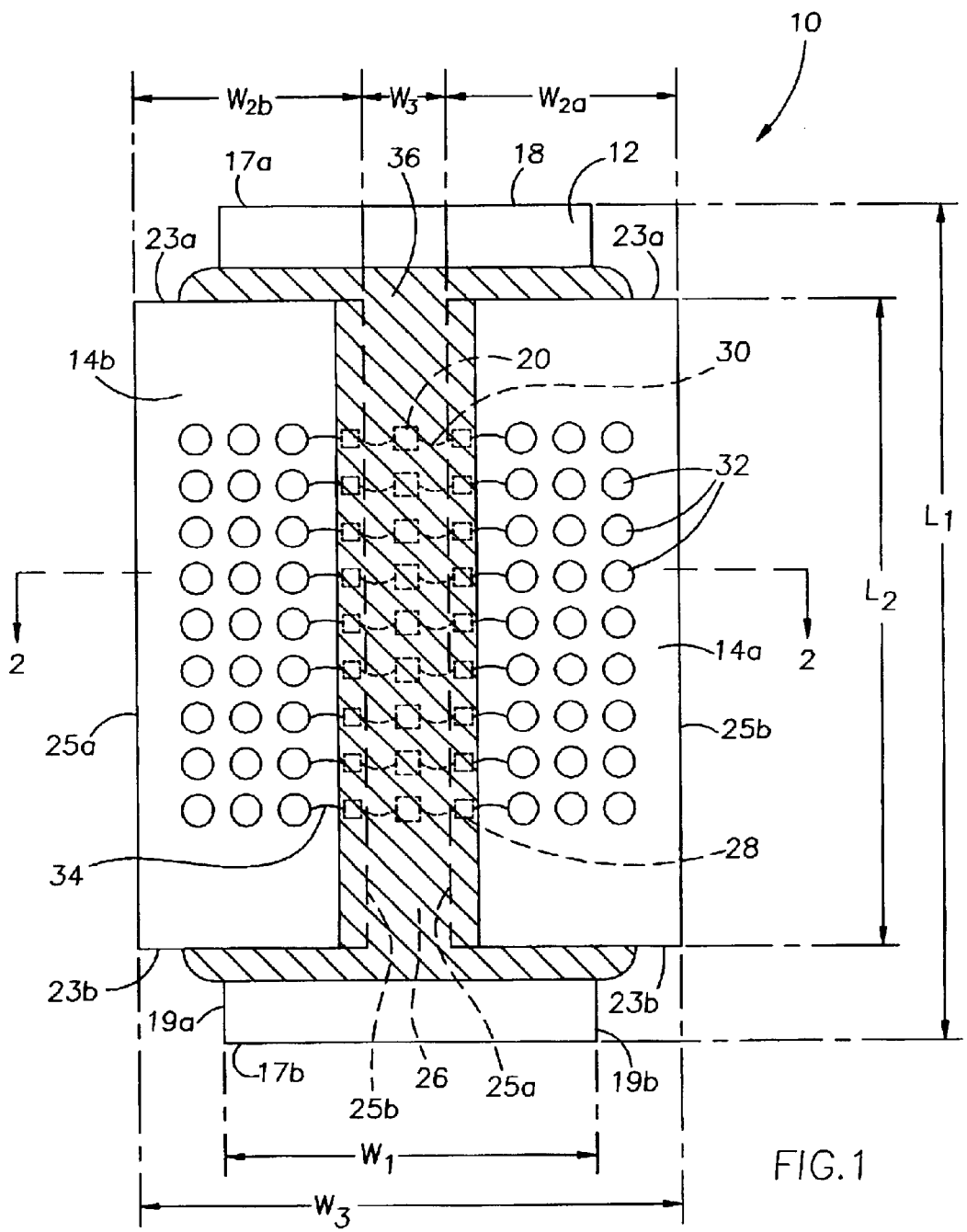
FIG. 1 is a bottom plan view of an embodiment of semiconductor die assembly according to the present invention, with a semiconductor die mounted on a pair of interposers.

In the following detailed description of the preferred embodiments, reference is made to the accompanying drawings, which form a part hereof, and in which is shown by way of illustration of specific preferred embodiments in which the invention may be practiced. These embodiments are described in sufficient detail to enable those skilled in the art to practice the invention, and it is to be understood that other embodiments maybe utilized and that logical, mechanical and electrical changes maybe made without departing from the spirit and scope of the inventions. The following detail description is, therefore, not to be taken in a limiting sense, and scope of the present invention is defined only by the pending claims.

The invention provides a semiconductor die package, which allows for a ball grid array disposed on an interposer substrate having a width that is greater than the attached semiconductor die while the length of the package corresponds to the die length.

An embodiment of a semiconductor die package 10 according to the invention is described with reference to FIGS. 1–5. The package 10 comprises a semiconductor die (integrated circuit chip) 12 disposed on a pair of support substrates or interposers 14$a$, 14$b$. The semiconductor die 12 includes a length L1, a width W1, first and second surfaces 16, 18, opposing sides 17$a$, 17$b$ and opposing sides 19$a$, 19$b$. A plurality of bond pads 20 is disposed on the first surface 16 of the die 12.

Each interposer 14$a$, 14$b$ includes a length L2, a width W2, first and second surfaces 22, 24, opposing sides 23$a$, 23$b$ and opposing sides 25$a$, 25$b$. The length L2 of the interposers 14$a$, 14$b$ is less than the length L1 of the die. The interposers 14$a$, 14$b$ can comprise an electrically insulating polymer material such as a resin reinforced with glass fibers, for example, bismaleimide triazine (BT) resin, epoxy resins such as FR-4 or FR-5 laminates, ceramics, and polyimide resins, a flexible polyimide film (e.g., KAPTON from DuPont, Wilmington, Del., or UPILEX from Ube Industries, Ltd., Japan), a multilayered substrate that can be produced by a build-up process as known in the art, among other substrates. In another embodiment, the interposers 14$a$, 14$b$ can comprise copper, for example, as the core material using a build-up processing technology (single-layer or multi-layer design, etc.) as known and used in the art, to form circuitry onto the copper substrate. A preferred material is a plastic laminate material, for example, BT resin with conductive copper traces formed on the top and bottom surfaces. A representative thickness of the interposers is about 50 $\mu$m to about 500 $\mu$m, and typically about 0.3 mm (300 $\mu$m).

Figure 5:
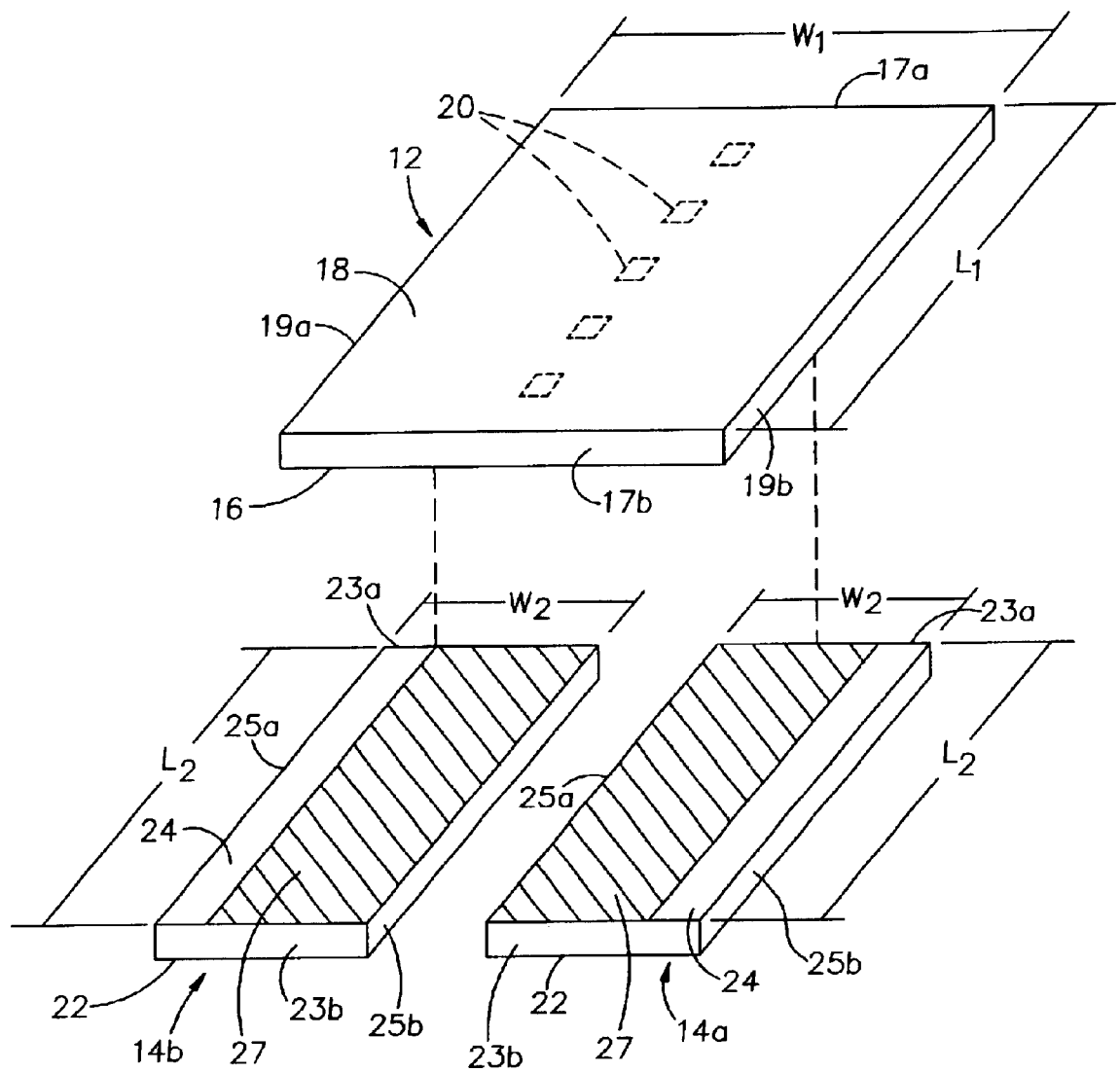
FIG. 5 is an exploded perspective view of a die and a pair of interposers with an adhesive element applied thereto for fabricating the die assembly of FIG. 1.

As depicted in exploded view in FIG. 5, the die 12 can be attached to the interposer substrates 14$a$, 14$b$ by use of an adhesive element 27. The adhesive element 27 can be applied onto the first (active) surface 16 of the die 12 and/or to the second surface 24 of the interposer substrates 14$a$, 14$b$. The adhesive element 27 can comprise any suitable adhesive material known in the art, including contact adhesives, thermoplastic adhesives and thermosetting adhesives, for example, a die-attach epoxy or equivalent, or a double-sided, multi-layered adhesive tape such as polyimide film coated on both sides with adhesive. The die 12 and/or the interposer substrates 14$a$, 14$b$ can be provided in a pre-taped form with an adhesive tape attached thereto, or an adhesive element 27 can be applied to either or both of the die 12 and the interposer substrates 14$a$, 14$b$ during fabrication of a die assembly and package. Many suitable adhesive application methods for liquid or gel adhesive application are known in the art, such as screen printing, roller applicator, spray, and transfer. Similarly, an adhesive tape may be applied from a dispenser and severed from a roll of tape, or applied from a transfer (carrier) film. In the illustrated example in FIG. 5, an adhesive material 27 has been applied to the second surface 24 of the interposer substrates 14$a$, 14$b$.

Figure 4:
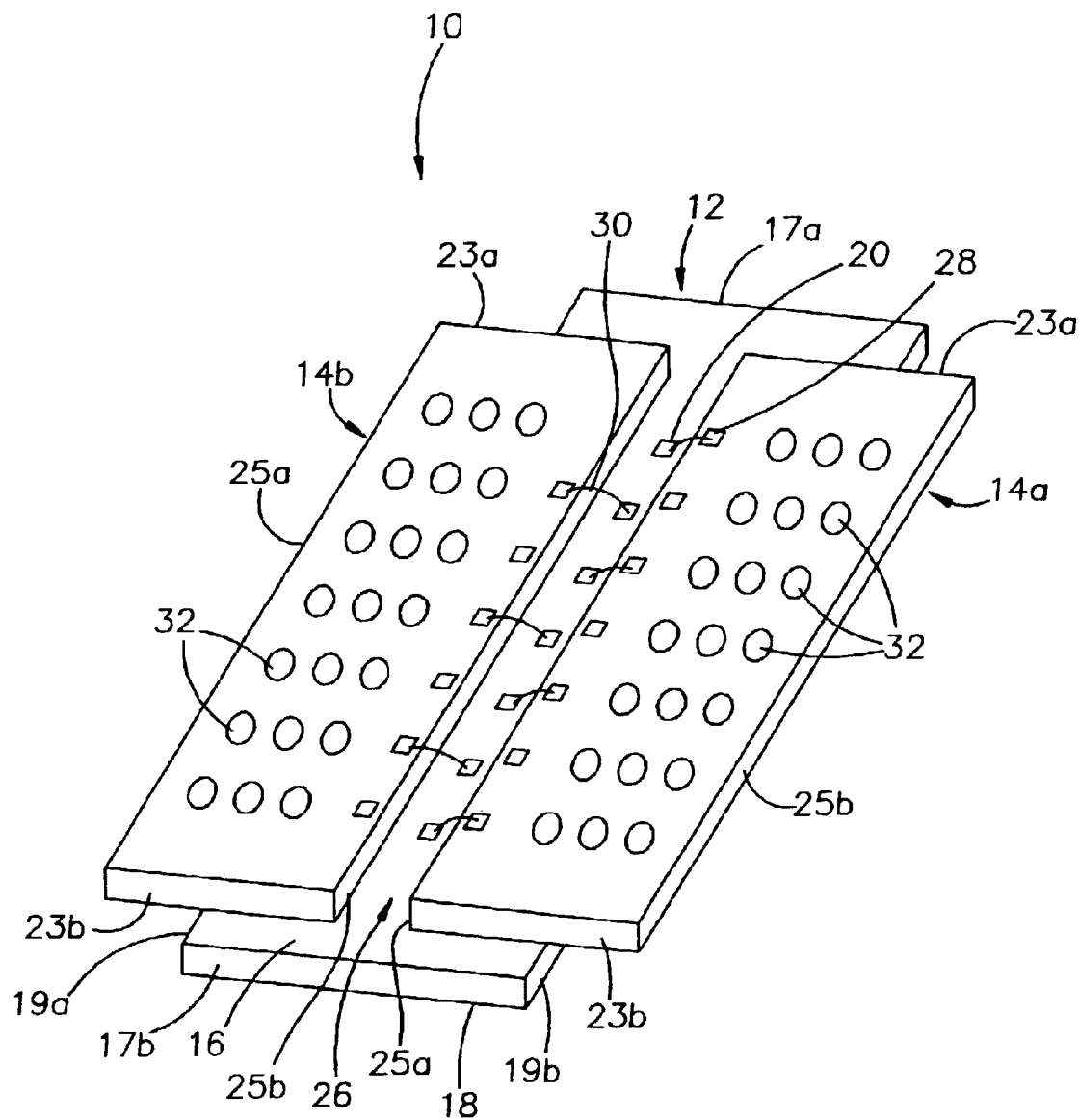
FIG. 4 is a perspective view of the underside of the die assembly of FIG. 1, with the molding compound not shown.

As depicted in FIGS. 1 and 4, the second surface 24 of each interposer 14$a$, 14$b$ is mounted onto the first surface (circuit side) 16 of the die 12 so as to define an opening or slot 26 therebetween having a width Ws, such that the bond pads 20 of the die are exposed therethrough. The interposers 14$a$, 14$b$ disposed on the die 12 define a width W3, which is the combined width W2$a$+W2$b$ of the interposers 14$a$, 14$b$ plus the width Ws of the slot. The interposers 14$a$, 14$b$ are positioned on the die such that the opposing sides 25$a$, 25$b$ of the interposers 14$a$, 14$b$ extend beyond the opposing sides 19$a$, 19$b$ of the chip, and the width W3 of the interposers disposed on the chip is greater than the width W1 of the chip 12. The interposers 14$a$, 14$b$ are also positioned on the die 12 such that the opposing sides 17a, 17b of the die extend beyond the opposing sides 23a, 23b of the interposers in a lengthwise direction, the length L2 of the interposers being up to about the length L1 of the die, and preferably less than the length L1. Thus, the interposers extend beyond the die in a widthwise direction but do not extend beyond the die in a lengthwise direction. Preferably, the die extends beyond the interposers in a lengthwise direction.

Figure 6:
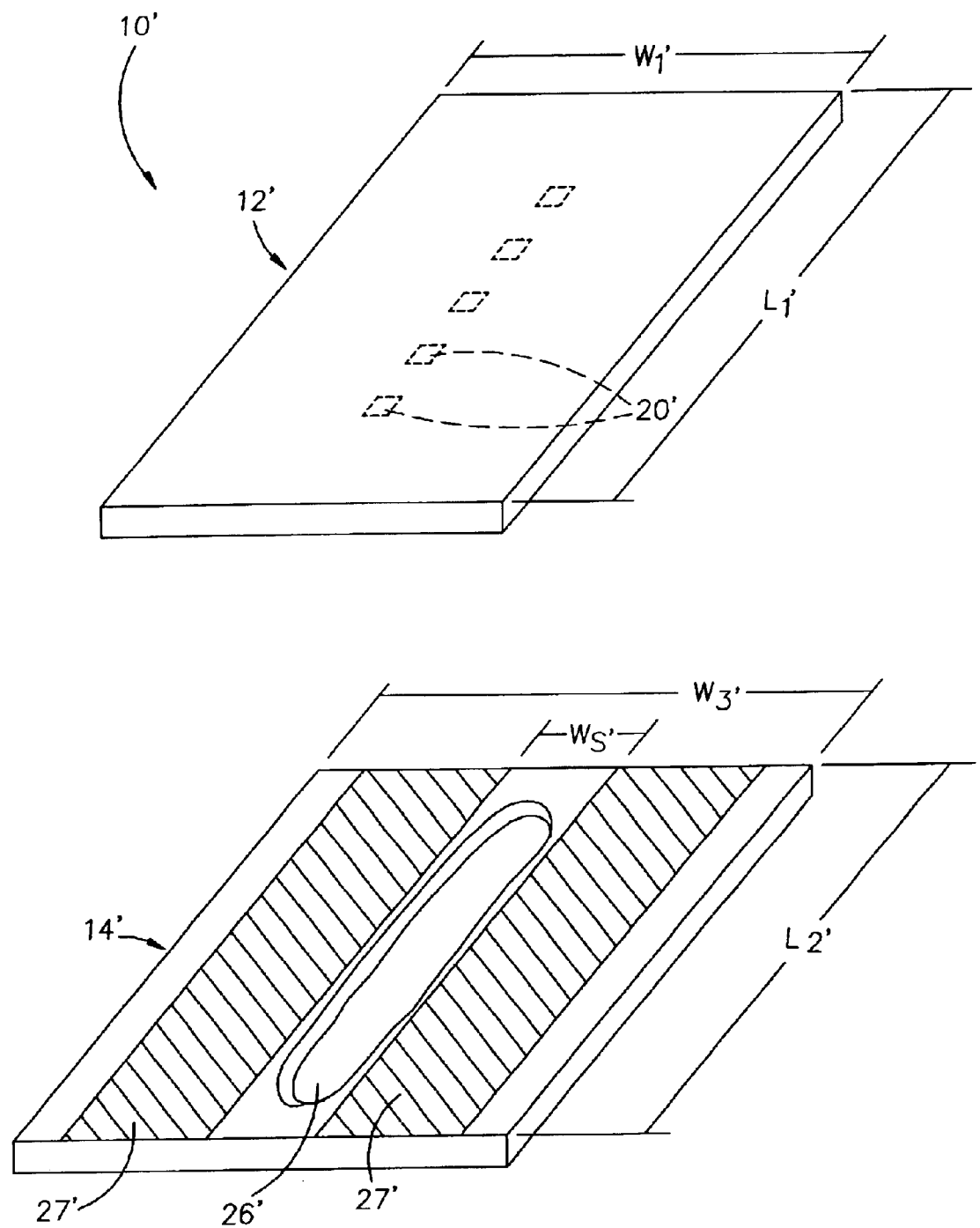
FIG. 6 is an exploded perspective view of a die and a unitary interposer substrate having a slot and an adhesive element applied thereto for fabricating another embodiment of a die assembly according to the invention.

As shown in an exploded view in FIG. 6, in another embodiment of a die assembly 10' according to the invention, the support (interposer) substrate 14' can be provided as a unitary sheet with a slot 26'. The support substrate 14' has a width W3', which includes the width Ws' of the slot 26', and a length L2'. The semiconductor die 12' is mounted on the support substrate 14' such that the bond pads 20' are disposed within the slot 26', and the substrate 14' extends beyond the die 12' in a widthwise direction but does not extend beyond the die 12' in a lengthwise direction.

Referring back to FIG. 1, after mounting the die 12 onto the interposer substrates 14a, 14b, the bond pads 20 of the die can be electrically connected to terminal pads 28 disposed on the first surface 22 of each interposer, by wire bonds 30 as shown, or other bonding element such as tape automated bonding ("TAB" tape) in which case a support structure would be included on the section of material that extends beyond the die edge, as is known in the industry. A bonding element can be attached, for example, by thermosonic bonding, ultrasonic bonding, tape automated bonding, or other technique known and used in the art. The terminal pads 28 are typically located along the periphery of the interposers adjacent to the opening 26.

Figure 2:
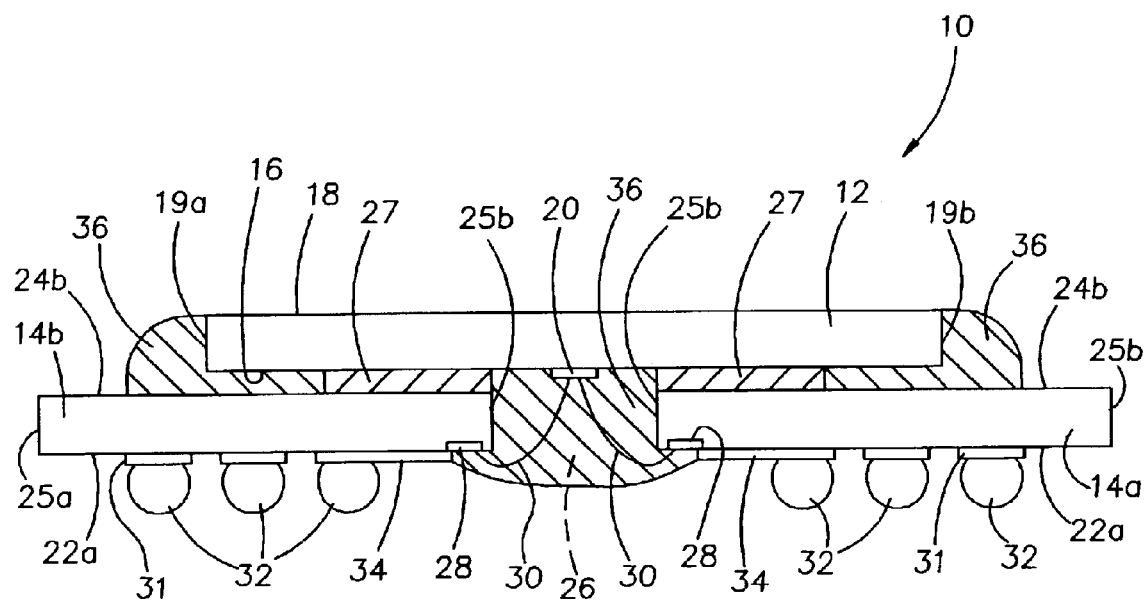
FIG. 2 is cross-sectional, side elevational view of the die assembly of FIG. 1 taken along line 2–2.
Figure 3:
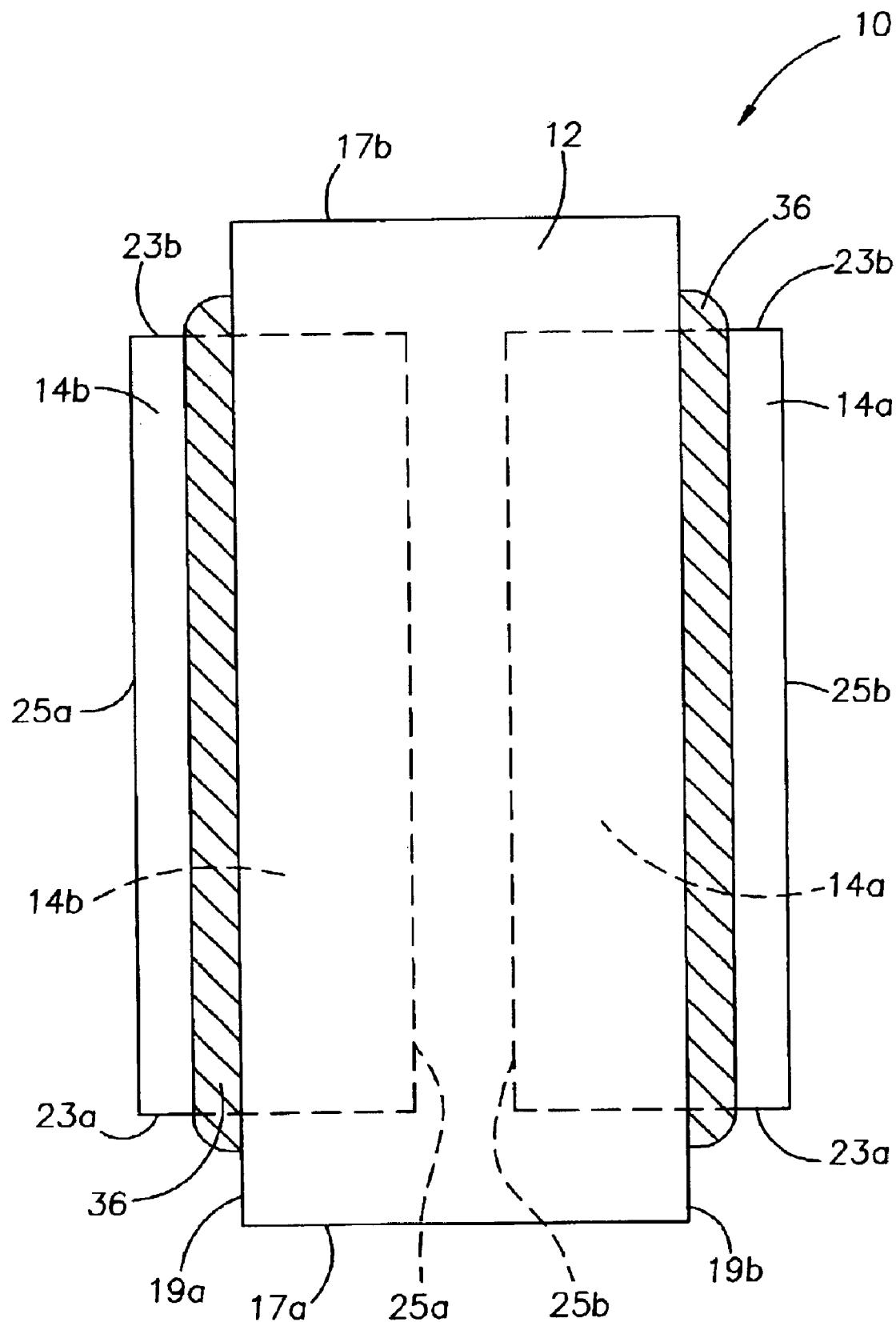
FIG. 3 is a top plan view of the die assembly of FIG. 1.

An array of external contacts 32 can be conventionally mounted on a plurality of ball pads 31 formed on the first surface 22 of each interposer substrate. The ball pads 31 are electrically connected to the terminal pads 28 through circuit traces 34, as shown in FIGS. 1–2. The external contacts 32 are typically in the form of conductive solder balls (or other suitable conductive material such as conductive epoxies or conductor-filled epoxies), bumps, columns, pins, and the like. The external contacts 32 provide external electrical connections to the die, and permit the die assembly package to be surface mounted to a printed circuit board (PCB) or other electronic component such as a motherboard of a computer, program logic controller (PLC), a testing apparatus, among others.

Advantageously, the extension of the interposers 14a, 14b widthwise on either side of the semiconductor die provides a greater surface area for supporting an increased number of external contacts (e.g., solder balls) while providing a die assembly and package having the same length as the length L1 of the die itself. The increased capacity for external contacts provides additional contacts for higher density chips, and provides for wider configurations. It also eliminates the need for retooling during fabrication of a die assembly in the test department. A standardized grid even on the die shrinks will allow test to share existing tooling for several die shrinks.

The die assembly can be partially or fully encapsulated with a dielectric molding compound using known techniques in the art, for example, screen printing, glob-top, pot molding, and transfer molding, resulting in an encapsulated die package 10. As shown, an encapsulant or molding compound 36 is disposed along the sides 19a, 19b and on the active surface 16 of the die 12, and within the slot 26 between the interposers 14a, 14b to encapsulate the bond pads 20, terminal pads 28 and wire bonds 30, and protect these features from environmental elements and physical harm during subsequent processing, storage, shipment and ultimately during end use. An exemplary molding compound is a thermoset epoxy resin, for example, a novolac epoxy resin-based compound, that produces a rigid plastic body surrounding the die. The molding compound can be dried, set or cured to a solid phase.

Figure 7:
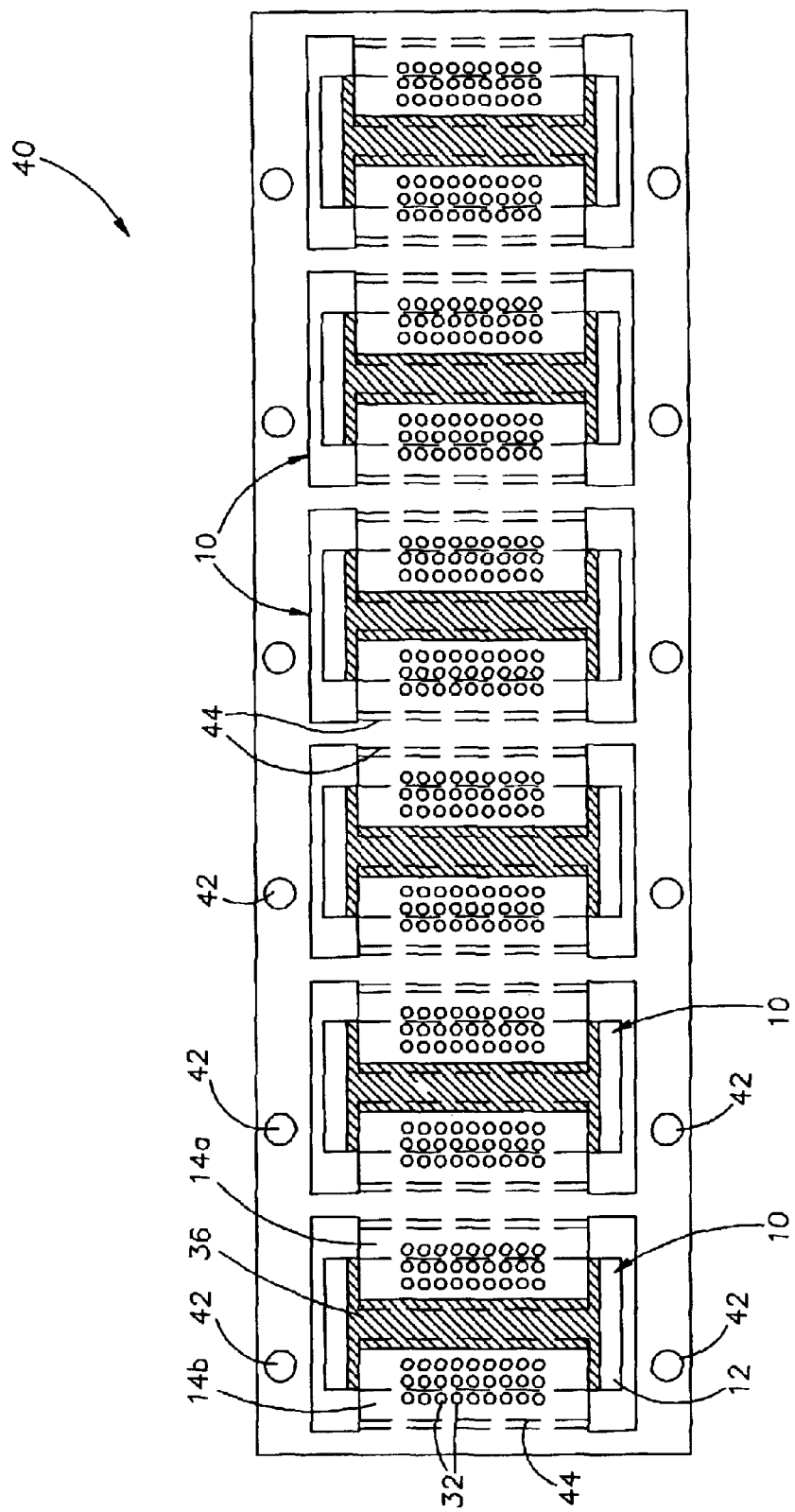
FIG. 7 is a top plan view of a panel with multiple die packages disposed thereon.

As shown in FIG. 7, the die assembly can be fabricated on a strip or panel support substrate 40 having indexing holes 42, on which multiple die packages 10 are formed. During packaging, the panel support substrate 40 is moved by lead frame handling equipment (not shown) through package fabrication machinery such as die attach equipment and wire bonders, by contacting the indexing holes 42 on the panel substrate 40. Die attach equipment attaches a plurality of dies 12 to the panel substrate 40, and the wire bonding equipment connects wire bonds to bonding pads (not shown) on the panel substrate 40 that are associated with respective dies. Conductive contacts such as solder balls (not shown) can be attached to the underside of the panel substrate 40 or can be pre-attached to the panel prior to being indexed by the lead frame handling equipment through the packaging equipment. Before or after encapsulation, the die packages 10 on the panel substrate 40 are singulated, for example, by cutting or shearing along an expansion slot or saw path 44, into individual die packages.

Figure 8:
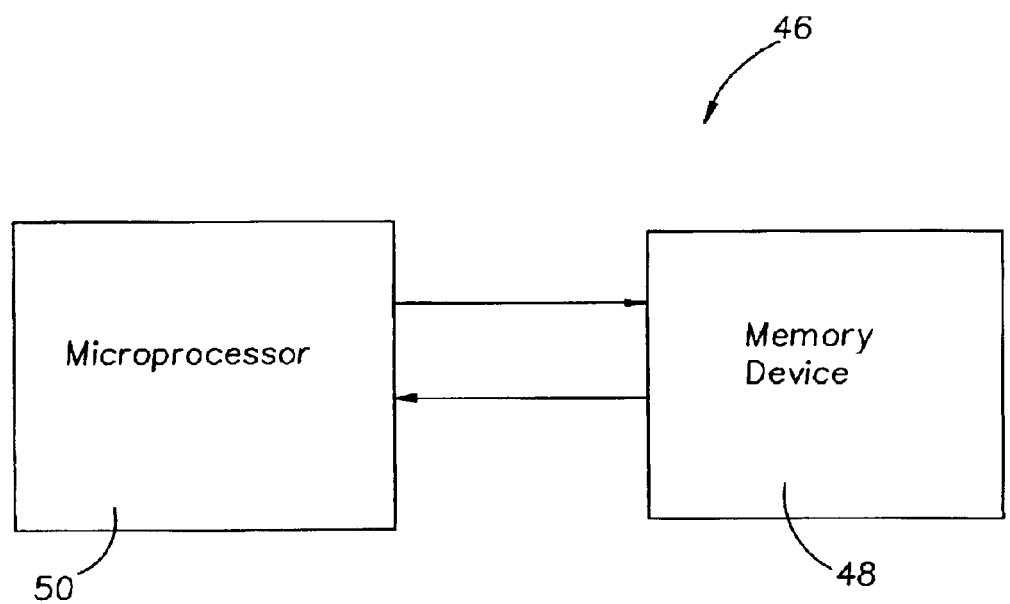
FIG. 8 is a block diagram of an embodiment of a system in which a die package of the invention can be used.

FIG. 8 illustrates an embodiment of a system 46 in which the present invention can be incorporated. The system includes a memory device 48 (e.g., static random access memory (SRAM), dynamic random access memory (DRAM), etc.) comprising a die assembly package according to the invention. The memory device 48 is coupled to a microprocessor 50, which may be programmed to carry out particular functions as is known in the art.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor die assembly, comprising:
   a semiconductor die comprising an active surface, a length, and a width; the active surface of the die mounted on a first surface of a support substrate, the support substrate comprising a length, a width, first and second surfaces, and a slot;
   wherein the support substrate mounted on the die extends beyond the die in a widthwise orientation and the die extends beyond the support substrate in a lengthwise orientation, and the length of the die assembly is about equal to the length of the die and the width of die assembly is about equal to the width of the support substrate.

2. The die assembly of claim 1, wherein the support substrate comprises a pair of interposer substrates mounted on the semiconductor die to form the slot thereinbetween.

3. The die assembly of claim 1, wherein the support substrate comprises a unitary substrate with the slot integrally formed therein.

4. The die assembly of claim 1, wherein the support substrate comprises a material selected from the group consisting of a resin reinforced with glass fibers, an epoxy resin laminate, a ceramic, a polyimide resin, and a polyimide film.

5. The die assembly of claim 1, wherein the support substrate comprises a plastic laminate material.

6. The die assembly of claim 1, wherein the support substrate comprises a copper core layer.

7. The die assembly of claim 1, further comprising bonding elements electrically connecting the active surface of the die through the slot to contacts on the second surface of the support substrate.

8. The die assembly of claim 1, further comprising a plurality of external contacts disposed on the second surface of the support substrate.

9. The die assembly of claim 8, wherein the external contacts comprise a conductive material selected from the group consisting of a conductive solder, a conductive epoxy, and a conductor-filled epoxy.

10. The die assembly of claim 8, wherein the external contacts are in the form of balls, bumps, columns, pins, or a combination thereof.

11. A semiconductor die assembly, comprising:
a semiconductor die having an active surface, a length, a width, and bond pads disposed on the active surface; and
a pair of interposers, each interposer having first and second surfaces, a length and a width, and terminal pads disposed on the first surface, the length of the interposers being less than the length of the semiconductor die;
the active surface of the semiconductor die mounted onto the second surface of each of die pair of interposers such that a gap having a width is defined between the interposers, and the bond pads of the semiconductor die are disposed within the gap; the semiconductor die mounted onto the interposers such that the combined widths of the interposers and the width of the gap is greater then the width of the semiconductor die and each interposer extends beyond the semiconductor die in a widthwise orientation, and the interposers do not extend beyond the semiconductor die in a lengthwise orientation.

12. An integrated circuit assembly, comprising:
an integrated circuit chip having a length and a width, first and second surfaces, and a plurality of bond pads disposed on the first surface; and
first and second interposers disposed on the first surface of the chip, each interposer having a length, a width, and first and second surfaces, the second surfaces of the first and second interposers disposed on the chip to define an opening therebetween with the bond pads of the chip exposed therethrough, the opening having a width, the length of each interposer being less than the length of the chip and the combined widths of the interposers and the opening being greater than the width of the chip, each of the first and second interposers comprising a plurality of terminal pads disposed on the first surface of said each interposer and adjacent to the opening, and the band pads of the chip electrically connected to the terminal pads.

13. The assembly of claim 12, further comprising a plurality of bonding elements connecting the bond pads to the terminal pads.

14. The assembly of claim 12, wherein the bonding element is selected from the group consisting of wire bonds, and TAB tape.

15. The assembly of claim 12, further comprising external contacts disposed on the first surface of said each interposer and electrically connected to the terminal pads through circuit traces.

16. The assembly of claim 12, wherein the external contacts comprise a conductive material selected from the group consisting of a conductive solder, a conductive epoxy, and a conductor-filled epoxy.

17. The assembly of claim 16, wherein the external contacts are in the form of balls, bumps, columns, pins, or a combination thereof.

18. The assembly of claim 12, wherein the chip is mounted onto the first and second interposers by an adhesive element.

19. The assembly of claim 18, wherein the adhesive element is selected from the group consisting of contact adhesive, thermoplastic adhesive, thermoplastic adhesive, and adhesive tape.

20. The assembly of claim 12, being at least partially encapsulated.

21. A semiconductor die assembly, comprising:
a semiconductor die having a circuit side, a length and a width, and a plurality of bond pads disposed on the circuit side; and
a pair of interposers, each interposer having first and second surfaces, a length and a width, and a plurality of terminal pads disposed on the first surface, the circuit side of the semiconductor die mounted onto the second surface of each of the pair of interposers, the pair of interposers configured to define a slot therebetween with the plurality of bond pads exposed through the slot and electrically connected to the plurality of terminal pads, and wherein the length of each interposer is less than the length of the semiconductor die and the combined widths of the pair of interposers is greater than the width of the semiconductor die.

22. The semiconductor assembly of claim 21, further comprising an array of external contacts disposed on the first surface of each of the pair of interposer and connected to the plurality of terminal pads through circuit traces.

23. The semiconductor assembly of claim 22, wherein the external contacts comprise solder, conductive epoxy, or conductor-filled epoxy.

24. The semiconductor assembly of claim 22, wherein the external contacts are in the form of balls, bumps, columns, pins, or a combination thereof.

25. The semiconductor assembly of claim 22, wherein each of the external contacts is mounted on a ball pad disposed on the first surface of the interposers.

26. The semiconductor assembly of claim 21, wherein the plurality of terminal pads are located adjacent to the slot.

27. The semiconductor assembly of claim 21, wherein the bond pads and the terminal pads are electrically connected by bonding elements.

28. The semiconductor assembly of claim 21, wherein the semiconductor die is mounted onto the pair of interposers by an adhesive material.

29. The semiconductor assembly of claim 21, further comprising an encapsulant disposed over the bond pads and the terminal pads.

30. An integrated circuit assembly, comprising:
an integrated circuit chip having first and second surfaces and a plurality of bond pads disposed on the first surface; and
first and second interposers disposed on the first surface of the chip to define a slot therebetween, each interposer having first and second surfaces, and a plurality of terminal pads disposed on the first surface of said each interposer, the bond pads of the chip exposed therethrough the slot and electrically connected to the plurality of terminal pads, wherein the chip extends beyond the interposers lengthwise and the interposers extend beyond the chip widthwise.

31. The assembly of claim 30, wherein a plurality of bonding elements connect the bond pads to the terminal pads.

32. The assembly of claim 30, wherein the slot, bonding elements, bond pads, and the terminal pads are encapsulated.

33. The assembly of claim 30, wherein sides of the chip are encapsulated and the second surface of the chip is exposed.

34. A semiconductor die construction, comprising:
a semiconductor die having a circuit side and a plurality of bond pads disposed on the circuit side; and
a pair of support substrates, each support substrate having first and second surfaces, the circuit side of the semiconductor die being mounted onto the second surface of each of the pair of support substrates such that a slot is defined between the support substrates, and the bond pads are disposed within the slot, a plurality of terminal pads disposed on the first surfaces of the support substrates adjacent to the slot, and the bond pads of the semiconductor die being electrically connected to the plurality of the terminal pads, wherein the die extends beyond the support substrates lengthwise, and the support substrates extend beyond the die widthwise.

35. The semiconductor construction of claim 34, further comprising a plurality of bonding elements connecting the bond pads to the terminal pads.

36. The semiconductor construction of claim 34, further comprising an array of external contacts disposed on the first surface of each of the support substrates and connected to the plurality of terminal pads through circuit traces.

37. An integrated circuit construction, comprising:
an electronic chip having a circuit side, a length and a width, and a plurality of bond pads disposed on the circuit side; and
a pair of spaced apart interposers mounted on the circuit side of the chip to define a slot therebetween, each interposer having first and second surfaces, a length and a width, and a plurality of terminal pads disposed on the first surface of said each interposer, the bond pads of the chip exposed therethrough the slot and electrically connected to the plurality of terminal pads, and wherein the length of each interposer is less than the length of the chip and the combined widths of the pair of interposers is greater than the width of the chip.

38. A semiconductor construction, comprising:
a semiconductor die having a circuit side, a length and a width, and a plurality of bond pads disposed on the circuit side; and
a pair of interposers, each interposer having first and second surfaces, a length and a width, and a plurality of terminal pads disposed on the first surface, the circuit side of the semiconductor die mounted onto the second surface of each of the pair of interposers to define a slot therebetween with the plurality of the bond pads exposed through the slot and electrically connected to the plurality of the terminal pads, and wherein the slot comprises a width, and the length of each interposer is less than the length of the semiconductor die and the combined widths of the pair of interposers and the width of the slot is greater than the width of the semiconductor die such that the die extends beyond the interposers lengthwise and the interposers extend beyond the die widthwise.

39. The semiconductor construction of claim 38, wherein the pair of interposers comprise an electrically insulating polymer material.

40. The semiconductor construction of claim 38, wherein the pair of interposers comprise a material selected from the group consisting of a resin reinforced with glass fibers, an epoxy resin laminate, a ceramic, a polyimide resin, and a polyimide film.

41. The semiconductor construction of claim 38, wherein the pair of interposers comprise a plastic laminate material.

42. The semiconductor construction of claim 41, wherein the plastic laminate material comprises an FR-4 laminate, an FR-5 laminate, or a combination thereof.

43. The semiconductor construction of claim 38, wherein the support substrate comprises a copper core layer.

44. A semiconductor die assembly, comprising:
at least one electronic chip having a circuit side and a plurality of bond pads disposed on the circuit side; and
a pair of spaced apart support substrates mounted on the circuit side of the chip to define a gap therebetween, each support substrate having first and second surfaces and a plurality of terminal pads disposed on the first surface of the support substrate, the bond pads of the chip exposed through the gap and electrically connected to the plurality of terminal pads, wherein the chip extends beyond each of the support substrates lengthwise and said each support substrate extends beyond the chip widthwise.

45. A semiconductor die assembly, comprising:
a semiconductor die comprising an active surface, a length, and a width; the active surface of the die mounted on a first surface of a support substrate comprising a unitary substrate with a slot disposed therein, a length, a width, and first and second surfaces;
wherein the support substrate mounted on the die extends beyond the die in a widthwise orientation and not in a lengthwise orientation, the length of the support substrate being less than the length of the die, and the size of the die assembly is about equal to the length of the die in a lengthwise orientation, and about equal to the width of the support substrate in a widthwise orientation.

46. The die assembly of claim 45, wherein the support substrate comprises a material selected from the group consisting of a resin reinforced with glass fibers, an epoxy resin laminate, a ceramic, a polyimide resin, and a polyimide film.

47. The die assembly of claim 45, wherein the support substrate comprises a plastic laminate material.

48. The die assembly of claim 45, wherein the support substrate comprises a copper core layer.

49. The die assembly of claim 45, further comprising bonding elements electrically connecting the active surface of the die through the slot to contacts on the second surface of the support substrate.

50. The die assembly of claim 45, further comprising a plurality of external contacts disposed on the second surface of the support substrate.

51. The die assembly of claim 50, wherein the external contacts comprise a conductive material selected from the group consisting of a conductive solder, a conductive epoxy, and a conductor-filled epoxy.

52. The die assembly of claim 50, wherein the external contacts are in the form of balls, bumps, columns, pins, or a combination thereof.

53. A semiconductor die assembly, comprising:
a semiconductor die having an active surface, a length and a width, and bond pads disposed on the active surface;
means for supporting the semiconductor die, said supporting means having a length and a width, first and second surfaces, terminal pads disposed on the first surface, and a slot having a width;
means for mounting the active surface of the semiconductor die on the second surface of the supporting means; and
means for electrically connecting the bond pads on the semiconductor die and the terminal pads on the supporting means;
the semiconductor die mounted on the supporting means with the mounting means disposed therebetween end the bond pads of the semiconductor die disposed within the slot at the supporting means, and the supporting means disposed within the length of the semiconductor die and the extending beyond the width of the semiconductor die, the length of the supporting means being less than the length of the semiconductor die.

54. The assembly of claim 53, wherein the supporting means comprises a pair of interposer substrates mounted on the semiconductor die to provide a slot thereinbetween.

55. The assembly of claim 53, wherein the supporting means comprises a substrate comprising a slot disposed therein.

56. The assembly of claim 53, wherein the supporting means comprises a material selected from the group consisting of a resin reinforced with glass fibers, an epoxy resin laminate, a ceramic, a polyimide resin, and a polyimide film.

57. The assembly of claim 53, wherein the supporting means comprises a plastic laminate material.

58. The assembly of claim 53, wherein the support substrate comprises a copper core layer.

59. The assembly of claim 53, wherein the mounting means comprises an adhesive material.

60. The assembly of claim 59, wherein the adhesive material is selected from the group consisting of contact adhesive, thermoplastic adhesive, thermosetting adhesive, and adhesive tape.

61. The assembly of claim 53, wherein the electrical connecting means is selected from the group consisting of wire bonds, and TAB tape.

62. The assembly of claim 53, further comprising an encapsulant material disposed over at least a portion of the semiconductor die.

63. A semiconductor die package, comprising:
a semiconductor die having an active surface, a length, a width, and bond pads disposed on the active surface; and
a pair of interposers, each interposer having first and second surfaces, a length and a width, and terminal pads disposed on the first surface, the length of the interposers being less than the length of the semiconductor die;
the active surface of the semiconductor die mounted onto the second surface of each of the pair of interposers such that a gap having a width is defined between the interposers, and the bond pads of the semiconductor die are disposed within the gap; the semiconductor die mounted onto the interposers such that the combined widths of the interposers and the width of the gap is greater than the width of the semiconductor die and each interposer extends beyond the semiconductor die in a widthwise orientation, and the interposers do not extend beyond the semiconductor die in a lengthwise orientation; and bonding elements connecting the bond pads to the terminal pads; and
electronic elements of the die are encapsulated.

64. The package of claim 63, wherein the bonding elements, bond pads, and the terminal pads are encapsulated.

65. The package of claim 63, wherein sides of the semiconductor die and the active surface are encapsulated.

66. The package of claim 63, further comprising a plurality of external contacts mounted on the first surface of each interposer.

67. A semiconductor die package, comprising:
a semiconductor die having an active surface, a length, a width, and bond pads disposed on the active surface; and
a pair of interposers, each interposer having first and second surfaces, a length and a width, and terminal pads disposed on the first surface, the length of the interposers being less than the length of the semiconductor die;
the active surface of the semiconductor die mounted onto the second surface of each of the pair of interposers such that a gap having a width is defined between the interposers, and the bond pads of the semiconductor die are disposed within the gap; and
electronic elements of the die are encapsulated;
wherein the semiconductor die is mounted onto the interposers such that the size of the die package is about equal to the length of the semiconductor die in a lengthwise orientation, and greater than the width of the semiconductor die in a widthwise orientation.

68. The package of claim 67, further comprising a plurality of external contacts mounted on the first surface of each interposer.

69. A semiconductor die package, comprising:
a semiconductor die comprising an active surface, a length, and a width; the active surface of the die mounted on a first surface of a support substrate comprising a length, a width, first and second surfaces, and a slot, the length of the support substrate being less than the length of the semiconductor die; bonding elements electrically connecting the active surface of the die through the slot to contacts on the second surface of the support substrate; a plurality of external contacts disposed on the second surface of the support substrate; and an encapsulant disposed over at least a portion of the active surface of the die, the bonding elements, and the contacts on the support substrate;
wherein the support substrate mounted on the die extends beyond the die in a widthwise orientation and not in a lengthwise orientation, and the size of the die package is about equal to the length of the die in a lengthwise orientation, and about equal to the width of the support substrate in a widthwise orientation.

70. The die package of claim 69, wherein the support substrate comprises a pair of interposer substrates mounted on the semiconductor die to provide the slot thereinbetween.

71. The die package of claim 69, wherein the support substrate comprises a unitary substrate with the slot disposed therein.

72. A die package, comprising:
a semiconductor die comprising an active surface, a length, and a width; the die mounted on a support substrate comprising a length and a width and an opening, the length of the support substrate being less than the length of the die and bond pads on the active surface of the die exposed through the opening;

means for mounting the die on the support substrate, the mounting means disposed between the die and the support substrate;

means for electrically connecting the die and the support substrate; and an encapsulant material disposed over at least a portion of the die;

wherein the support substrate mounted on the die extends beyond the die in a widthwise orientation and not in a lengthwise orientation, and the size of the die package is about equal to the length of the die in a lengthwise orientation, and about equal to the width of the support substrate in a widthwise orientation.

73. The package of claim 72, wherein the support substrate comprises a pair of interposers mounted on the die with a slot thereinbetween to provide the opening.

74. The package of claim 72, wherein the support substrate comprises a unitary sheet with a slot disposed therein to provide the opening.

75. A method of fabricating a semiconductor die assembly, comprising the steps of:

providing an semiconductor die comprising an active side, and a plurality of bond pads disposed on the active side, a length, and a width;

providing first and second interposers, each interposer having first and second surfaces, a length, a width, and a plurality of terminal pads disposed on the first surface of the each interposer; and disposing the second surfaces of the interposers on the active side of the semiconductor die such that a slot, having a width, is defined between the interposers to expose the plurality of bond pads on the semiconductor die, and the semiconductor die extends beyond the interposers lengthwise and said each interposer extends beyond the chip widthwise.

76. The method of claim 75, wherein the step of providing the interposers comprises fabricating the interposers wherein the length of each of the interposers is up to about the length of the semiconductor die.

77. The method of claim 76, wherein the length of each of the interposers is less than the length of the semiconductor die.

78. The method of claim 75, further comprising the step of electrically connecting the plurality of bond pads to the plurality of terminal pads.

79. The method of claim 75, further comprising, prior to the step of disposing the interposers on the chip, the step of applying an adhesive material onto at least one of the circuit side of the chip, and the second surfaces of each interposer.

80. The method of claim 75, further comprising, prior to the step of disposing the interposers on the chip, the step of applying the adhesive material to the second surfaces of the interposers.

81. The method of claim 79, wherein the adhesive element comprises a die-attach adhesive, a tape adhesive, or a combination thereof.

82. The method of claim 75, further comprising the step of mounting an array of external contacts on the first surface of said each interposer.

83. The method of claim 82, wherein the external contacts comprise a conductive material selected from the group consisting of a conductive solder, a conductive epoxy, and a conductor-filled epoxy.

84. The method of claim 75, wherein the step of electrically connecting comprises attaching a plurality of bonding elements to the bond pads and the terminal pads.

85. The method of claim 75, wherein the step of electrically connecting the bond pads to the terminal pads comprises thermosonic bonding, ultrasonic bonding, or tape automated bonding.

86. The method of claim 75, further comprising the step of applying an encapsulant over at least a portion of the die.

87. A method of fabricating a semiconductor die assembly, comprising the step of:

providing a semiconductor die having a length and a width first and second surfaces, and a plurality of bond pads disposed on the first surface;

providing a pair of interposers, each interposer having first and second surfaces, a length and a width, and a plurality of terminal pads disposed on the first surface of the each interposer; and mounting the first surface of the semiconductor die onto the second surface of each of the pair of interposers such that a slot is defined between the pair of interposers to expose the plurality of bond pads on the chip; and the semiconductor die extends beyond the interposers lengthwise, and said each interposer extends beyond the die widthwise.

88. The method of claim 87, further comprising electrically connecting the plurality of the bond pads to the plurality of the terminal pads.

89. The method of claim 87, further comprising mounting an array of external contacts on the first surface of said each interposer.

90. The method of claim 88, further comprising applying an encapsulant over the bond pads, the terminal pads, and the electrically connection therebetween.

91. A method of fabricating a semiconductor die assembly, comprising the steps of:

providing a semiconductor die having an active surface, a length, a width, and a plurality of bond pads disposed on the active surface;

providing first and second interposers, each interposer having first and second surfaces, a length, a width, and a plurality of terminal pads disposed on the first surface of the each interposer, wherein the length of each interposer is less than the length of the semiconductor die; and mounting the active surface of the semiconductor die onto the second surfaces of the interposers such that a gap is defined between the interposers to expose the plurality of bond pads on the semiconductor die, and the semiconductor die extends beyond the interposers lengthwise and each interposer extends beyond the die widthwise.

92. The method of claim 91, further comprising disposing an array of external contacts on the first surface of said each interposer.

93. The method of claim 91, further comprising electrically connecting the plurality of the bond pads to the plurality of the terminal pads.

94. A method of fabricating a semiconductor die assembly, comprising the steps of:

providing a semiconductor die having an active surface, a length, a width, and bond pads disposed on the active surface;

providing first and second interposers, each interposer having first and second surfaces, a length, a width, and terminal pads disposed on the first surface of the each interposer, wherein the length of each interposer is up to about and less than the length of the semiconductor die; and mounting the active surface of the semiconductor die onto the second surfaces of the interposers such that a gap is defined between the interposers to expose the bond pads on the semiconductor die, and the semiconductor die is mounted onto the interposers such that the combined widths of the interposer, and the width of the gap is greater than the width of the semiconductor die and each interposer extends beyond the semiconductor die in a widthwise orientation, and the interposers do not extend beyond the semiconductor die in a lengthwise orientation.

95. A method of fabricating a semiconductor die assembly, comprising the steps of:

providing a semiconductor die having an active surface, a length, and a width, providing a support substrate comprising a unitary substrate with a slot disposed therein, a length, a width, and first and second surfaces, the length of the support substrate being less than the length of the semiconductor die;

mounting the active surface of the die on a first surface of a support substrate such that the support substrate extends beyond the die in a widthwise orientation and not in a lengthwise orientation, and the size of the die assembly is about equal to the length of the die in a lengthwise orientation, and about equal to the width of the support substrate in a widthwise orientation.

96. The method of claim 95, further comprising electrically connecting the active surface of the die through the slot to contacts on the second surface of the support substrate.

97. The method of claim 95, further comprising mounting a plurality of external contacts on the second surface of the support substrate.

98. The method of claim 97, wherein the external contact comprise a conductive material selected from the group consisting of a conductive solder, a conductive epoxy, and a conductor-filled epoxy.

99. The method of claim 95, further comprising encapsulating at least a portion of the die.

100. A method of fabricating a semiconductor die package, comprising the steps of:

providing a semiconductor die having a length and a width, first and second surfaces, and a plurality of bond pads disposed on the first surface;

providing first and second interposers, each interposer having first and second surfaces, a length and a width, and a plurality of terminal pads disposed on the first surface of the each interposer, the length of the interposer being less than the length of the die;

mounting the first surface of the semiconductor die onto the second surface of each of the pair of interposers such that a slot is defined between the pair of interposers to expose the plurality of bond pads on the chip and wherein the slot comprises a width; such that the die extends beyond the interposers lengthwise and the interposers extend beyond the die widthwise;

electrically connecting the plurality of the bond pads to the plurality of the terminal pads; and encapsulating at least the bond pads, the terminal pads and the electrical connection therebetween.

101. A method of fabricating a semiconductor die package, comprising the steps of:

providing a semiconductor die having a circuit side, and a plurality of bond pads disposed on the first surface;

providing a pair of support substrates having first and second surfaces and a plurality of terminal pads disposed on the first surface of the each support substrate;

mounting the second surfaces of the pair of spaced apart support substrates on the circuit side of the die to define a slot therebetween and to expose the plurality of bond pads on the die wherein the die extends beyond each of the support substrates lengthwise and said each support substrate extends beyond the chip widthwise;

electrically connecting the plurality of the bond pads to the plurality of the terminal pads; and encapsulating at least a portion of the semiconductor die.

102. A method of fabricating a semiconductor die package, comprising the steps of:

providing a semiconductor die having an active surface, a length, and a width, providing a support substrate comprising a unitary substrate with a slot disposed therein, a length, a width, and first and second surfaces, the length of the support substrate being less than the length of the semiconductor die;

mounting the active surface of the die on a first surface of a support substrate such that the support substrate extends beyond the die in a widthwise orientation and not in a lengthwise orientation, and the size of the die assembly is about equal to the length of the die in a lengthwise orientation, and about equal to the width of the support substrate in a widthwise orientation;

electrically connecting the active surface of the die through the slot to contacts on the second surface of the support substrate;

encapsulating at least a portion of the semiconductor die; and mounting a plurality of external contacts on the second surface of the support substrate.

103. The method of claim 102, wherein the external contacts comprise a conductive material selected from the soup consisting of a conductive solder, a conductive epoxy, and a conductor-filled epoxy.

104. A system, comprising:

a microprocessor; and a memory device in communication with the microprocessor, the memory device comprising a semiconductor die package; the die package comprising:

a semiconductor die having an active surface, a length, a width, and bond pads disposed on the active surface; and a pair of interposers, each interposer having first and second surfaces, a length and a width, and terminal pads disposed on the first surface, the length of the interposers being less than the length of the semiconductor die;

the active surface of the semiconductor die mounted onto the second surface of each of the pair of interposers such that a gap having a width is defined between the interposers, and the bond pads of the semiconductor die are disposed within the gap; the semiconductor die mounted onto the interposers such that the combined widths of the interposers and the width of the gap is greater than the width of the semiconductor die and each interposer extends beyond the semiconductor die in a widthwise orientation, and the interposers do not extend beyond the semiconductor die in a lengthwise orientation;

bonding elements connecting the bond pads to the terminal pads;
a plurality of external contacts disposed on the first surfaces of the interposers; and
an encapsulant disposed over electronic components of the die.

105. A system, comprising:
a microprocessor; and
a memory device in communication with the microprocessor, the memory device comprising a die package, comprising:
a semiconductor die comprising an active surface, a length, and a width; the active surface of the die mounted on a first surface of a support substrate comprising a length, a width, first and second surfaces, and a slot, the length of the support substrate being less than the length of the die; bonding elements electrically connecting the active surface of the die through the slot to contacts on the second surface of the support substrate; a plurality of external contacts disposed on the second surface of the support substrate; and an encapsulant disposed over at least a portion of the active surface of the die, the bonding elements;
wherein the support substrate mounted on the die extends beyond the die in a widthwise orientation and not in a lengthwise orientation, and the size of the die package is about equal to the length of the die in a lengthwise orientation, and about equal to the width of the support substrate in a widthwise orientation.

106. The system of claim 105, wherein the support substrate comprises a pair of interposer substrates mounted on the semiconductor die to provide a slot thereinbetween.

107. The system of claim 105, wherein the support substrate comprises a unitary substrate with a slot disposed therein.

108. The system of claim 105, wherein the support substrate comprises a material selected from the group consisting of a resin reinforced with glass fibers, an epoxy resin laminate, a ceramic, a polyimide resin, and a polyimide film.

109. The system of claim 105, wherein the support substrate comprises a plastic laminate material.

110. The system of claim 105, wherein the support substrate comprises a copper core layer.

111. A die assembly, comprising: a die having a length and width, and mounted on a substrate having an opening, a length less than the length of the die and a width greater than the width of the die and bond pads of the die are exposed through the opening of the substrate.

112. A die assembly, comprising: a die having a length and width, and mounted on a substrate having an opening, a length less than the length of the die and a width greater than the width of the die, wherein the support substrate extends beyond the die widthwise and the die extends beyond the support substrate lengthwise, and bond pads of the die are, exposed through the opening of the substrate.

113. A die assembly, comprising: a die mounted on a support substrate having an opening, such that the support substrate extends beyond the die widthwise and the die extends beyond the support substrate lengthwise, and bond pads of the die are exposed through the opening of the substrate.

114. A die assembly, comprising: a die having a length and width, and mounted on a substrate having an opening a length less than the length of the die and a width greater than the width of the die, wherein the support substrate extends beyond the die widthwise and the die extends beyond the support substrate lengthwise, and bond pads of the die are exposed through the opening of the substrate.

115. A die assembly, comprising: a die having a length and width, and mounted on a substrate having an opening a length less than the length of the die, wherein the support substrate extends beyond the die widthwise and not lengthwise, and bond pads of the die are exposed through the opening of the substrate.

116. A panel, comprising: a plurality of die assemblies, at least one of the die assemblies according to claim 1.

117. A panel, comprising: a plurality of die assemblies, at least one of the die assemblies according to claim 30.

118. A panel, comprising: a plurality of die assemblies, at least one of the die assemblies according to claim 45.

119. A panel, comprising: a plurality of die assemblies, at least one of the die assemblies according to claim 111.

120. A panel, comprising: a plurality of die assemblies, at least one of the die assemblies according to claim 112.

121. A panel, comprising: a plurality of die assemblies, at least one of the die assemblies according to claim 113.

122. A panel, comprising: a plurality of die assemblies, at least one of the die assemblies according to claim 114.

123. A panel, comprising: a plurality of die assemblies, at least one of the die assemblies according to claim 115.

124. A system, comprising:
a microprocessor; and
a memory device in communication with the microprocessor, and comprising a die assembly, comprising: a die having a length and width, and mounted on a substrate having an opening, a length less than the length of die and a width greater than the width of the die, wherein bond pads of the die are exposed through the opening of the substrate.

125. A system, comprising:
a microprocessor; and
a memory device in communication with the microprocessor, and comprising a die assembly, comprising: a die having a length and width, and mounted on a substrate having an opening, length less than the length of the die and a width greater than the width of the die, wherein the support substrate extends beyond the die widthwise and the die extends beyond the support substrate lengthwise, and bond pads of the die are exposed through the opening of the substrate.

126. A system, comprising:
a microprocessor; and
a memory device in communication with the microprocessor, the memory device comprising a die assembly, comprising: a die mounted on a support substrate having an opening, such that the support substrate extends beyond the die widthwise and the die extends beyond the support substrate lengthwise, and bond pads of the die are exposed through the opening of the substrate.

127. A system, comprising:
a microprocessor; and
a memory device in communication with the microprocessor, and comprising a die assembly, comprising: a die having a length and width, and mounted on a substrate having an opening, a length less than the length of the die and a width greater than the width of the die, wherein the support substrate extends beyond the die widthwise and the die extends beyond the support substrate lengthwise, and bond pads of the die are exposed through the opening of the substrate.

128. A system, comprising:

a microprocessor; and a memory device in communication with the microprocessor, and comprising a die assembly, comprising: a die having a length and width, and mounted on a substrate having an opening a length less than the length of the die, wherein the support substrate extends beyond the die widthwise and not lengthwise, and bond pads of the die are exposed through the opening of the substrate.

129. The assembly of claim 111, wherein the substrate comprises a pair of interposer substrates mounted on the die to provide the opening thereinbetween.

130. The assembly of claim 111, wherein the substrate comprises a unitary substrate with the opening disposed therein.

* * * * *

UNITED STATES PATENT AND TRADEMARK OFFICE
CERTIFICATE OF CORRECTION

PATENT NO. : 6,903,464 B2
DATED : June 7, 2005
INVENTOR(S) : David J. Corisis

It is certified that error appears in the above-identified patent and that said Letters Patent is hereby corrected as shown below:

Column 16,
Line 41, replace "soup" with -- group --.

Signed and Sealed this

Sixteenth Day of August, 2005

JON W. DUDAS
*Director of the United States Patent and Trademark Office*